(12) United States Patent
Lee et al.

(10) Patent No.: US 8,748,958 B1
(45) Date of Patent: Jun. 10, 2014

(54) PHASE-CHANGE RANDOM ACCESS MEMORY DEVICE AND METHOD OF MANUFACTURING THE SAME

(71) Applicant: SK hynix Inc., Gyeonggi-do (KR)

(72) Inventors: Hyun Min Lee, Gyeonggi-do (KR); Jung Taik Cheong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/845,599

(22) Filed: Mar. 18, 2013

(30) Foreign Application Priority Data

Dec. 26, 2012 (KR) .................. 10-2012-0153454

(51) Int. Cl.
*H01L 21/02* (2006.01)
*H01L 21/00* (2006.01)
*H01L 27/115* (2006.01)
*H01L 21/28* (2006.01)

(52) U.S. Cl.
CPC .... *H01L 27/11556* (2013.01); *H01L 21/28291* (2013.01)
USPC ............................................. 257/295; 438/3

(58) Field of Classification Search
CPC .............. H01L 27/11514; H01L 27/11556; H01L 21/28291; H01L 29/517; H01L 29/518
USPC ......................................... 257/295; 438/3, 95
See application file for complete search history.

(56) References Cited

U.S. PATENT DOCUMENTS 7,985,654 B2 * 7/2011 Breitwisch et al. ............ 438/422
2012/0225504 A1 * 9/2012 Hong et al. ..................... 438/17

FOREIGN PATENT DOCUMENTS

KR   1020010058464   7/2001
KR   1020110077919   7/2011

* cited by examiner

*Primary Examiner* — William D Coleman
(74) *Attorney, Agent, or Firm* — IP & T Group LLP

(57) ABSTRACT

A phase-change random access memory device and a method of manufacturing the same are provided. The method includes providing a semiconductor substrate including a heating electrode, forming an interlayer insulating layer including a preliminary phase-change region on the semiconductor substrate, reducing a diameter of an inlet portion of the preliminary phase-change region to be smaller than that of a bottom portion of the preliminary phase-change region, filling an insulating layer having a void in the preliminary phase-change region using a difference between the diameter of the inlet portion and the diameter of the bottom portion, removing the insulating layer to an interface between the inlet portion and the bottom portion, thereby forming a key hole exposing the heating electrode, and forming a phase-change material layer to be buried in the key hole and the preliminary phase-change region.

15 Claims, 3 Drawing Sheets

PHASE-CHANGE RANDOM ACCESS MEMORY DEVICE AND METHOD OF MANUFACTURING THE SAME

CROSS-REFERENCES TO RELATED APPLICATION

This application claims priority under 35 U.S.C. 119(a) to Korean application number 10-2012-0153454, filed on Dec. 26, 2012, in the Korean Patent Office, which is incorporated by reference in its entirety.

BACKGROUND OF THE INVENTION

1. Technical Field

The inventive concept relates to a phase-change random access memory (PRAM) device, and more particularly, to a fine PRAM device and a method of fabricating the same.

2. Related Art

A PRAM device that is one of resistance memory devices includes a phase-change material of which resistance is changed depending on temperature. As the phase-change material, there is typically a chalcogenide material containing germanium (Ge), antimony (Sb), and/or tellurium (Te). The phase-change material is changed into an amorphous state or a crystalline state depending on temperature to define a reset state (or logic "1") or a set state (or logic "0").

Current PRAM devices may need to lower a reset current, that is, a current required to cause a phase-change material to be in an amorphous state. The reset current of the PRAM device may be determined by a contact area between a heating electrode and the phase-change material and resistance of the phase-change material.

Thus, in recent years, efforts to lower the reset current by reducing the contact area between the heating electrode and the phase-change material, which may be controllable in the current process, have continued.

SUMMARY

One or more exemplary embodiments of the present invention are provided to a PRAM device that may reduce a reset current, and a method of manufacturing the same.

According to one aspect of an exemplary embodiment of the present invention, there is provided a method of manufacturing a phase-change random access memory (PRAM) device. The method may include providing a semiconductor substrate including a heating electrode, forming an interlayer insulating layer including a preliminary phase-change region on the semiconductor substrate, reducing a diameter of an inlet portion of the preliminary phase-change region to be smaller than that of a bottom portion of the preliminary phase-change region, filling an insulating layer having a void in the preliminary phase-change region using a difference between the diameter of the inlet portion and the diameter of the bottom portion, removing the insulating layer to an interface between the inlet portion and the bottom portion, thereby forming a key hole exposing the heating electrode, and forming a phase-change material layer to be buried in the key hole and the preliminary phase-change region.

According to another aspect of an exemplary embodiment of the present invention, there is provided a method of manufacturing a phase-change random access memory (PRAM) device. The method may include providing a semiconductor substrate including a heating electrode, forming an interlayer insulating layer on the semiconductor substrate, etching the interlayer insulating layer, thereby forming a preliminary phase-change region exposing the heating electrode, forming a first nitride layer on the preliminary phase-change region, burying an oxide layer in a lower portion of the preliminary phase-change region to expose a portion of a sidewall of the preliminary phase-change region, forming a spacer on the exposed portion of the sidewall of the preliminary phase-change region, selectively removing the oxide layer, forming a second nitride layer in the preliminary phase-change region, etching back the first nitride layer, the spacer, and the second nitride layer until the spacer is entirely removed.

According to still another aspect of an exemplary embodiment of the present invention, there is provided a phase-change random access memory (PRAM) device. The PRAM device may include a heating electrode formed on a semiconductor substrate, an interlayer insulating layer formed on the semiconductor substrate and including a preliminary phase-change region exposing a top of the heating electrode, a nitride layer formed in the preliminary phase-change region to have a fixed height and including a key hole exposing a portion of the top of the heating electrode, and a phase-change material layer formed to be buried in the preliminary phase-change region.

These and other features, aspects, and embodiments of the present invention are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
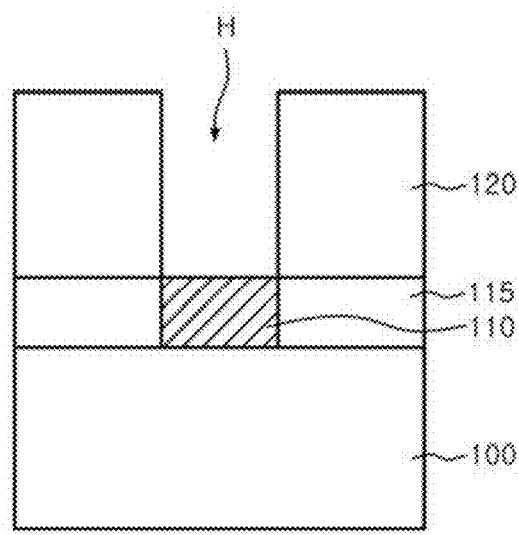
FIGS. 1 to 6 are cross-sectional views sequentially illustrating processes for a method of manufacturing a PRAM device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it may be directly on the other or substrate, or intervening layers may also be present.

Referring to FIG. 1, a first interlayer insulating layer 115 in which a heating electrode 110 is formed is formed on a semiconductor substrate 100. The heating electrode 110 may be formed by forming a hole (not shown) in the first interlayer insulating layer 115 and burying a conductive material in the hole. In the exemplary embodiment, the semiconductor substrate 100 may include a word line (not shown) and a switching device (not shown). A second interlayer insulating layer 120 is formed on the first interlayer insulating layer 115. The second interlayer insulating layer 120 is partially etched to confine a preliminary phase-change region H exposing the heating electrode 110.

Figure 2:
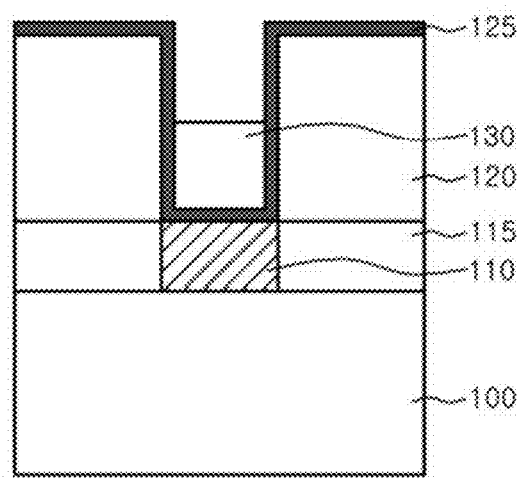

Referring to FIG. 2, a first nitride layer 125 is formed along a surface of the second interlayer insulating layer 120 including the preliminary phase-change region H. A preliminary oxide layer 130a is formed on a surface of the first nitride layer 125 to be buried in the preliminary phase-change region H. The preliminary oxide layer 130a is etched back and thus the preliminary oxide layer 130a remains in the preliminary phase-change region H. The etching back may be performed using $C_xF_y$ gas and the remaining preliminary oxide layer 130a may have a height corresponding to, for example, 40% to 80% of a height of the preliminary phase-change region H. Hereinafter, the remaining preliminary oxide layer 130a is referred to as an oxide layer 130. An inlet portion and a bottom portion of the preliminary phase-change region H are confined by the oxide layer 130. For example, a portion of the preliminary phase-change region H in which the oxide layer is formed becomes the bottom portion and a portion of the preliminary phase-change region H in which the oxide layer is not formed becomes the inlet portion.

Figure 3:
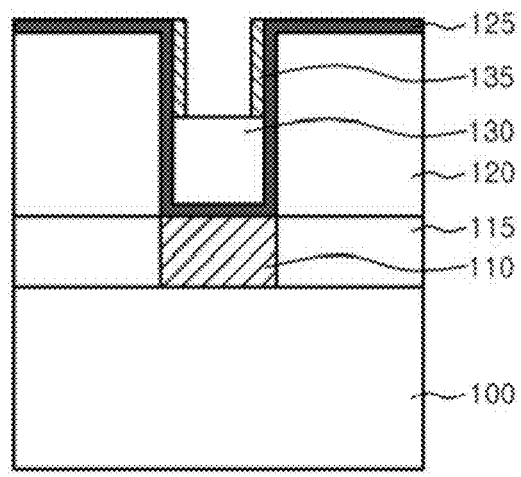

Referring to FIG. 3, a spacer 135 is formed on an exposed sidewall of the preliminary phase-change region H, that is, a sidewall of the inlet portion of the preliminary phase-change region H. The spacer 135 is formed of a nitride layer. A size of a void to be formed later is determined by a width of the spacer 135.

Figure 4:
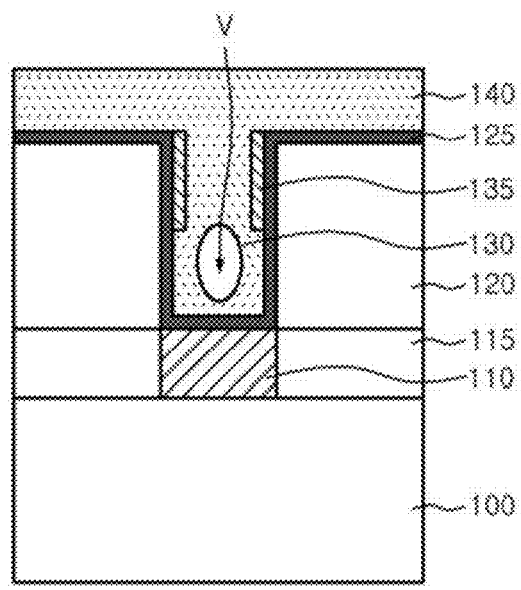

Referring to FIG. 4, the oxide layer 130 is selectively etched. The selective etching may be performed using a wet etching method. A second nitride layer 140 is then deposited to be buried in the preliminary phase-change region H. At this time, because the preliminary phase-change region H has a structure in which the inlet portion thereof (the upper portion of the preliminary phase-change region H) is narrower than the bottom portion thereof (the lower portion of the preliminary phase-change region H) due to the spacer 135, the burying of the second nitride layer 140 is not easy. Therefore, the second nitride layer 140 is filled in the preliminary phase-change region H so that the second nitride layer 140 is not completely buried in the whole preliminary phase-change region H and thus a void V is formed in the second nitride layer 140.

The voice V is a structure generated by a physical shape of the preliminary phase-change region H and a size of the void V may be controlled according to a space of the inlet portion, that is, a thickness of the spacer 135. For example, when the space of the inlet portion is narrowed, that is, when the thickness of the spacer 135 is increased, the size of the void V may be increased. Further, since controlling of a deposition thickness is more accurate than controlling of an etching thickness, the size of the void may be accurately controlled through the controlling of the deposition thickness of the spacer 135.

Figure 5:
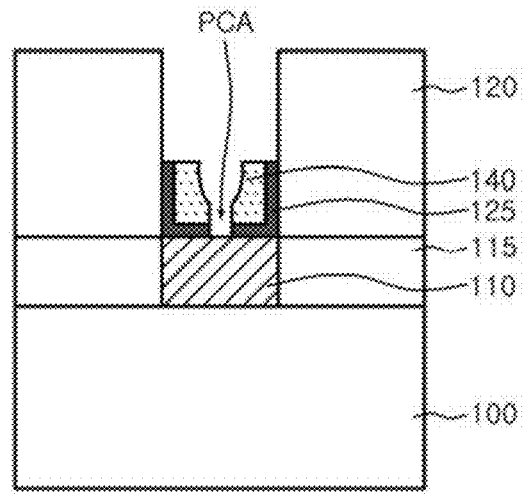

As illustrated in FIG. 5, an anisotropic etching process is performed on the second nitride layer 140, the first nitride layer 125, and the spacer 135 until the spacer 135 is completely removed. The anisotropic etching process may be performed, for example, using CHF gas and $O_2$ plasma gas. The anisotropic etching process may be performed so that a removing rate of a nitride layer to an oxide Payer is 1:1. In the anisotropic etching process of the second nitride layer 140, the first nitride layer 125, and the spacer 135, an etching gas is transferred into the void V and an etching is done in a bottom of the void V. Therefore, a key hole PCA exposing the heating electrode 110 is generated. The key hole PCA is a structure that is naturally generated by the etching process using the void V. The key hole PCA has a resolution equal to or less than a resolution of general exposure equipment.

Figure 6:
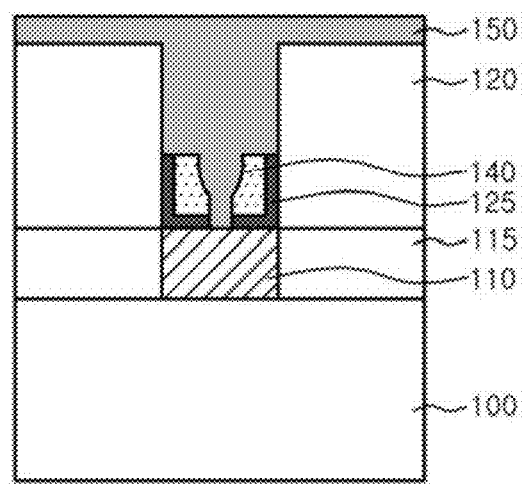

As illustrated in FIG. 6, a phase-change material layer 150 is deposited to be buried in the key hole PCA and the preliminary phase-change region H.

Since the phase-change material layer 150 comes in contact with the heating electrode 110 through the key hole PCA, a contact area between the heating electrode 110 and the phase-change material layer 150 is reduced to a very small area corresponding to a cross-section of the key hole PCA.

Therefore, the reset current of the PRAM device may be considerably reduced.

As described above, the exemplary embodiment causes a width of a inlet portion of a through hole to be reduced, causes a void in a material to be deposited later to be generated, and forms a key hole using the void. As described in the exemplary embodiment, when the shape of the contract hole is deformed by deposition technology (spacer forming technology), the void and key hole may be generated to be more reproducible and have more accurate sizes, as compared when the shape of the contact hole is deformed by an etching process.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a phase-change random access memory (PRAM) device, comprising:
    providing a semiconductor substrate including a heating electrode;
    forming an interlayer insulating layer including a preliminary phase-change region on the semiconductor substrate;
    reducing a diameter of an inlet portion of the preliminary phase-change region to be smaller than that of a bottom portion of the preliminary phase-change region;
    filling an insulating layer having a void in the preliminary phase-change region using a difference between the diameter of the inlet portion and the diameter of the bottom portion;
    removing the insulating layer to an interface between the inlet portion and the bottom portion, thereby forming a key hole exposing the heating electrode; and
    forming a phase-change material layer to be buried in the key hole and the preliminary phase-change region.

2. The method of claim 1, further comprising: between the forming an interlayer insulating layer including an preliminary phase-change region on the semiconductor substrate and the reducing a diameter of an inlet portion of the preliminary phase-change region to be smaller than that of a bottom portion of the preliminary phase-change region,
    forming a nitride layer along a surface of the preliminary phase-change region; and
    forming an oxide layer in a bottom portion of the preliminary phase-change region.

3. The method of claim 2, wherein the forming an oxide layer in a bottom portion of the preliminary phase-change region includes:
    depositing the oxide layer to be buried in the preliminary phase-change region; and etching back the oxide layer so that a height of the oxide layer is lower than a whole height of the preliminary phase-change region.

4. The method of claim 2, wherein the reducing a diameter of an inlet portion of the preliminary phase-change region to be smaller than that of a bottom portion of the preliminary phase-change region includes:

forming a spacer on a sidewall of the preliminary phase-change region exposed by the oxide layer; and selectively removing the oxide layer.

5. The method of claim 4, wherein the removing the insulating layer to an interface between the inlet portion and the bottom portion, thereby forming a key hole exposing the heating electrode includes:

removing the nitride layer, the spacer, and the insulating layer through an etching process until the heating electrode is exposed, wherein the key hole is formed by an etching gas provided in the etching process through the void.

6. The method of claim 4, wherein at least one of the spacer and the insulating layer is a nitride layer.

7. A method of manufacturing a phase-change random access memory (PRAM) device, the method comprising:

providing a semiconductor substrate including a heating electrode;

forming an interlayer insulating layer on the semiconductor substrate;

etching the interlayer insulating layer, thereby forming a preliminary phase-change region exposing the heating electrode;

burying an oxide layer in a lower portion of the preliminary phase-change region to expose a portion of a sidewall of the preliminary phase-change region;

forming a spacer on the exposed portion of the sidewall of the preliminary phase-change region;

selectively removing the oxide layer;

forming a nitride layer in the preliminary phase-change region;

etching back the spacer and the nitride layer until the spacer is entirely removed.

8. The method of claim 7, wherein the spacer is formed of a nitride layer.

9. The method of claim 7, wherein forming a nitride layer in the preliminary phase-change region includes:

forming a nitride layer having a void in the preliminary phase-change region, wherein a size of the void is controlled by a thickness of the spacer.

10. The method of claim 9, wherein the etching back the spacer and the nitride layer includes:

transferring an etching material through the void, thereby forming a key hole exposing the heating electrode.

11. The method of claim 10, further comprising: after the etching back the spacer and the nitride layer, forming a phase-change material layer in the preliminary phase-change region and the key hole to be in contact with the exposed heating electrode.

12. A phase-change random access memory (PRAM) device comprising:

a heating electrode formed on a semiconductor substrate;

an interlayer insulating layer formed on the semiconductor substrate and including a preliminary phase-change region exposing the heating electrode;

a nitride layer formed in the preliminary phase-change region to have a fixed height and including a key hole exposing a portion of the heating electrode; and a phase-change material layer formed to be buried in the preliminary phase-change region and the key hole.

13. The PRAM device of claim 12, wherein the nitride layer is includes:

a first nitride layer formed on a sidewall of the preliminary phase-change region to have a fixed height; and a second nitride layer formed on a sidewall of the first nitride layer and including the key hole exposing the portion of the heating electrode.

14. The PRAM device of claim 12, wherein the key hole includes a bottom portion exposing the portion of the heating electrode and an inlet portion opposite to the bottom portion, wherein a diameter of the bottom portion is smaller than that of the inlet portion.

15. The PRAM device of claim 12, wherein the phase change material layer is formed to be in contact with the portion of the heating electrode through the key hole.

\* \* \* \* \*